United States Patent
Mheen et al.

(10) Patent No.: US 7,554,074 B2
(45) Date of Patent: Jun. 30, 2009

(54) IMAGE SENSOR FOR LOW-NOISE VOLTAGE OPERATION

(75) Inventors: Bong Ki Mheen, Daejeon (KR); Min Hyung Cho, Daejeon (KR); Mi Jin Kim, Daejeon (KR); Young Joo Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/866,698

(22) Filed: Oct. 3, 2007

(65) Prior Publication Data
US 2008/0093534 A1    Apr. 24, 2008

(30) Foreign Application Priority Data
Oct. 20, 2006  (KR)  ............... 10-2006-0102431
Jun. 28, 2007  (KR)  ............... 10-2007-0064194

(51) Int. Cl.
*H03F 3/08* (2006.01)
*H01L 27/00* (2006.01)
*H04N 3/14* (2006.01)

(52) U.S. Cl. ................. 250/214 R; 250/208.1; 348/308

(58) Field of Classification Search ........ 250/214 R, 250/214.1, 208.1; 257/E27.132, 291, 440, 257/288; 348/249, 308
See application file for complete search history.

(56) References Cited

U.S. PATENT DOCUMENTS

| | | | | |
|---|---|---|---|---|
| 4,878,120 | A  * | 10/1989 | Matsumoto et al. | 348/307 |
| 6,864,920 | B1 * | 3/2005 | Kindt et al. | 348/308 |
| 7,022,965 | B2 | 4/2006 | Manabe et al. | |
| 7,110,030 | B1 * | 9/2006 | Kochi et al. | 348/308 |
| 2002/0163584 | A1 * | 11/2002 | Kokubun et al. | 348/308 |
| 2003/0016296 | A1 * | 1/2003 | Watanabe | 348/294 |
| 2004/0262679 | A1 * | 12/2004 | Ohsawa | 257/331 |
| 2005/0017155 | A1 * | 1/2005 | Manabe et al. | 250/214.1 |
| 2005/0167704 | A1 * | 8/2005 | Ezaki et al. | 257/233 |
| 2006/0146158 | A1 * | 7/2006 | Toros et al. | 348/308 |

FOREIGN PATENT DOCUMENTS

| | | |
|---|---|---|
| JP | 2003-143480 | 5/2003 |
| KR | 2000-0041451 A | 7/2000 |
| KR | 1020040038225 | 5/2004 |
| WO | WO2004/044989 | 5/2004 |

OTHER PUBLICATIONS http://highered.mcgraw-hill.com/sites/dl/free/0073191639/366537/Chapter_4.pdf.*

(Continued)

*Primary Examiner*—Georgia Y Epps
*Assistant Examiner*—Jennifer Bennett
(74) *Attorney, Agent, or Firm*—Ladas & Parry LLP

(57) ABSTRACT

An image sensor operated in a pseudo pinch-off condition capable of reducing a reset voltage of a photodiode and reducing a dark current and fixed pattern noise generated due to discordance of characteristics between pixels is presented. The image sensor has a photosensitive pixel, a driving circuit and an intermediary circuit. The photosensitive pixel can have a photodiode generating a photoelectrons, a transfer transistor transferring the photoelectrons to a diffusion node, and a reset transistor resetting the diffusion node. The driving circuit generates a driving switching signal with respect to the transfer and resist transistors. The intermediary circuit changes characteristics of the signal to drive the photosensitive pixel in a pseudo pinch-off mode.

20 Claims, 11 Drawing Sheets

OTHER PUBLICATIONS

Chris Parks et al; "Large area interline CCD with low dark current;" Sensors and Camera Systems for Scientific, Industrial, and Digital Photography Applications IV, Proceeding of SPIE-IS&T Electronic Imaging, SPIE vol. 5017 (2003).

\* cited by examiner

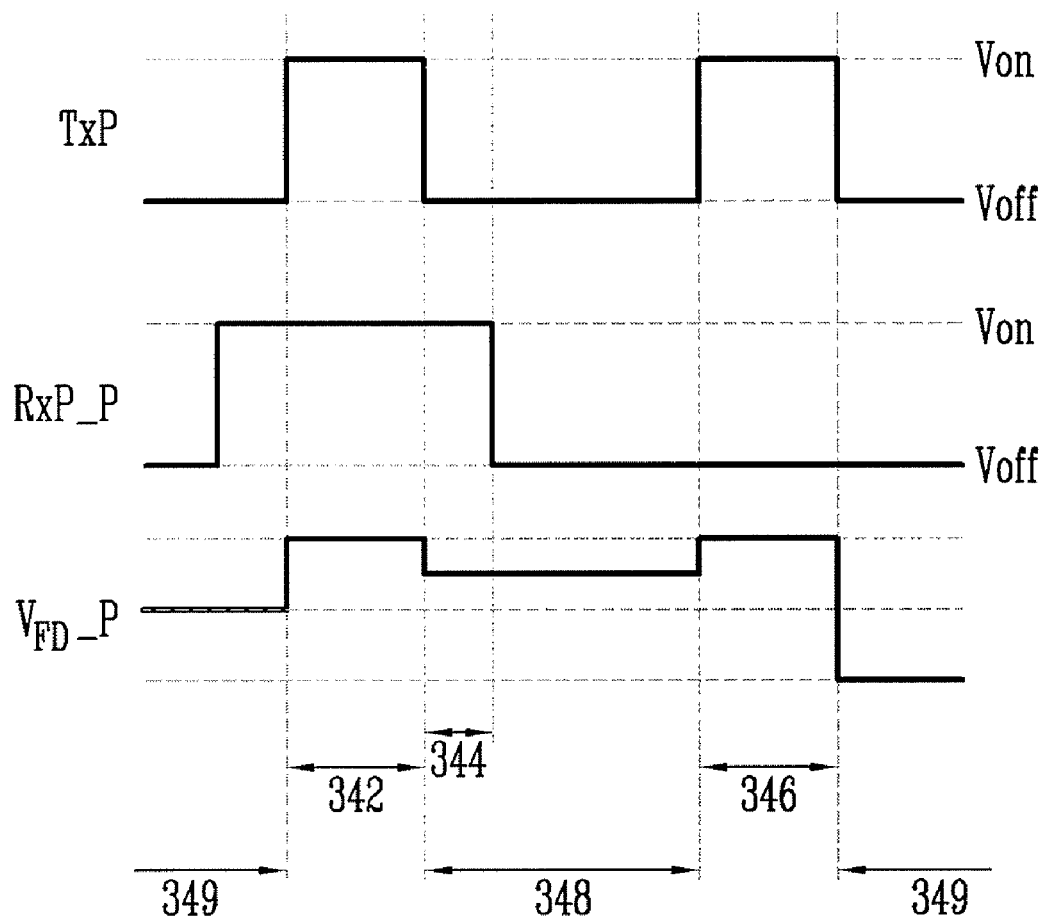

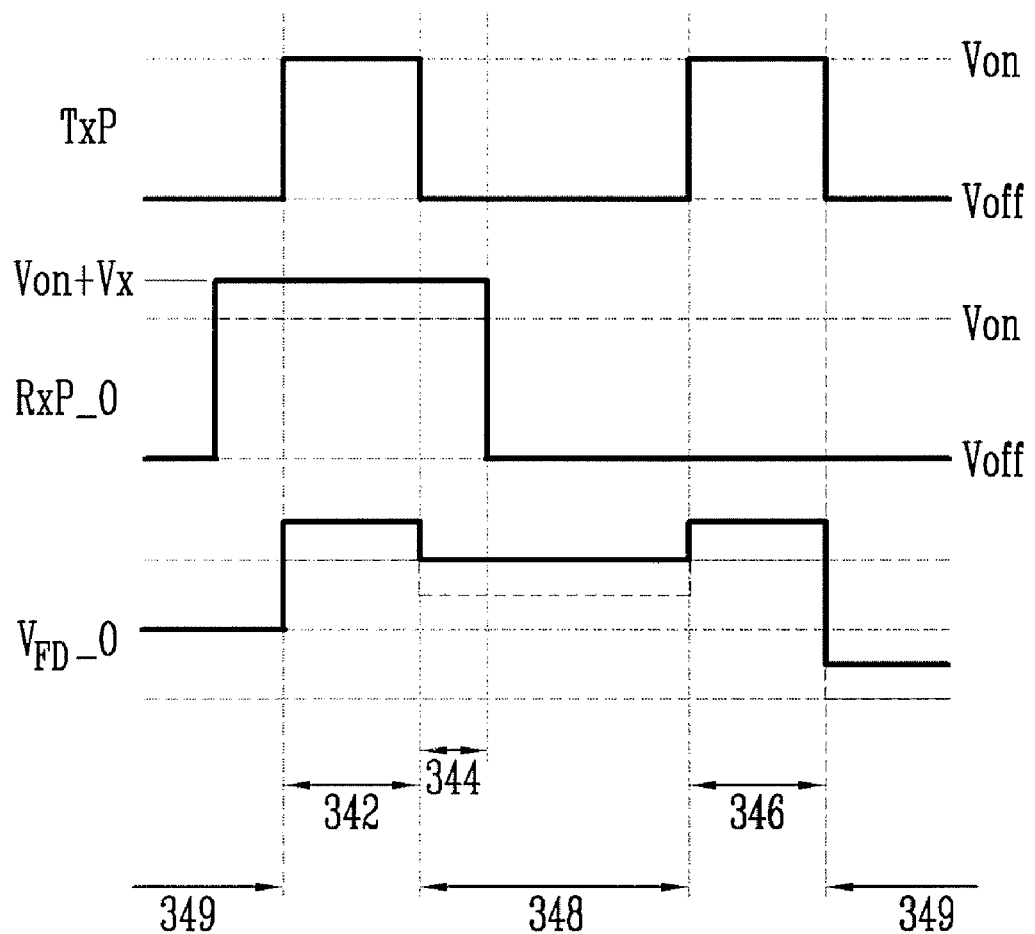

IMAGE SENSOR FOR LOW-NOISE VOLTAGE OPERATION

CROSS-REFERENCE TO RELATED APPLICATION

This application claims priority to and the benefit of Korean Patent Application No. 2006-102431, filed Oct. 20, 2006, and No. 2007-64194, filed Jun. 28, 2007, the disclosure of which is incorporated herein by reference in its entirety.

BACKGROUND

1. Field of the Invention

The present invention relates to an image sensor and a driving circuit of a transfer transistor for charge transfer in a light receiving unit in the image sensor. More particularly, the present invention relates to a method of driving a transfer transistor which can constantly maintain a depletion degree of charges in photodiode reset at a low operating voltage condition and can very effectively reduce dark current and fixed pattern noise by additionally reinforcing a reset function, and an image sensor using the same.

This work was supported by the IT R&D program of Ministry of Information and Communication/Institute for Information Technology Advancement [2006-S-004-01, Silicon-based high-speed optical interconnection IC.]

2. Discussion of Related Art

Image sensors may be classified into a charge-coupled device (CCD) sensor and a CMOS image sensor, which basically utilize an electron-hole pair separated by light having a higher energy than a silicon bandgap. In image sensors, an amount of irradiated light is generally estimated by collecting electrons or holes.

A CMOS image sensor can be manufactured using a conventional CMOS semiconductor manufacturing process as is, and may include a photodiode and a transistor in each image pixel, which is similar to a general CMOS device. Also, it may integrate a pixel array and a circuit for processing and searching an image signal in the same chip. Thus, the CMOS image sensor may overcome a shortcoming of the CCD that has to have such an image signal processor in a separate chip, adapt various image sensor structures because of its integrated structure, and provide flexibility in performing various subsequent processes.

One of the structures widely used for a CMOS image sensor is a 4-transistor pixel structure, as illustrated in FIG. 1. In the above structure, a photodiode PD, which is a light receiving unit, and four NMOS transistors constitute one unit pixel. Among the four NMOS transistors, a transfer transistor TX serves to transfer a photo charge generated from the photodiode PD to a diffusion node region FD or deplete the photodiode PD in a reset step, a reset transistor Rx serves to emit charges stored in the diffusion node region FD or the photodiode PD for signal detection, a drive transistor Dx serves as a source follower transistor, and a switch transistor Sx serves to switch and address signals. The transfer transistor TX may be formed of a gate, a gate oxide layer and a p-type substrate, the photodiode PD may generally have an $n^-$ type or $n^o$ type doping region and a surface p-type doping region, and a diffusion node 131 may be have an $n^+$ type doping region.

In FIG. 1, the photodiode PD receiving light and a capacitor 118 disposed parallel thereto constitute a light receiving part, and the transfer transistor TX, which transfers the received electron, serves to transfer electrons generated by photons to the diffusion node 131.

The transfer transistor Tx serves as a transmission channel which moves electrons generated from the photodiode PD by applying a predetermined voltage to a gate 111 of the transfer transistor Tx to the diffusion node 131, or serves to reset the photodiode PD by completely eliminating the electrons. The diffusion node 131 includes a diffusion capacitance 114 and a gate capacitance of the drive transistor Dx, wherein the diffusion node 131 is reset by the reset transistor Rx. To be more specific, the diffusion node 131 is reset for correlated double sampling (CDS) right before bringing the electrons of the photodiode PD, or by applying a reset voltage to the diffusion node 131 for resetting the photodiode PD. In order to obtain a two-dimensional image, a voltage is applied to a gate 141 of the switch transistor Sx to select one column. In particular, one pixel is biased by a cu-rent source 150, which operates the drive transistor Dx and the switch transistor Sx so that the voltage of the diffusion node 131 is read out to an output node 142.

The illustrated CMOS image sensor having four transistors transfers photon-induced carriers accumulated in the photodiode to the floating diffusion node after the photodiode reset and detects the amount of the photon-induced carriers by voltage drop of the diffusion node. Here, in order to accurately and uniformly detect the amount of the accumulated photon-induced carriers, a transfer operation in the same level as the reset of the transfer transistor is needed. Thus, the conventional CMOS image sensor having four transistors employs a complete reset-type pinned photodiode structure for stable reset and transfer operations. The pinned photodiode is a diode using a state without a voltage variation by fully depleting mobile charges in the photodiode. In this case, ideally, a photodiode voltage is always pinned to a specific value irrespective of an external bias environment such as a voltage of the diffusion node, and thus reset and transfer conditions according to the transfer transistor operation may be always maintained on a specific level.

However, characteristics of the conventional 4-transistor CMOS image sensor may deteriorate due to a decrease in operating voltage or a change in process conditions. In particular, this is because the reset and transfer conditions may depend on conditions of the transfer gate voltage and voltage of the diffusion node. These will now be described in detail.

In a conventional driving method using a power supply voltage VDD as a turn-on voltage of a transistor, the voltage of the floating diffusion node in reset is VDD-Vth_RX that is obtained by subtracting a threshold voltage Vth_RX of the reset transistor RX from a gate voltage VDD of the reset transistor. Also, a difference between the gate voltage VDD of the transfer transistor and the gate voltage VDD-Vth_RX of the floating diffusion node becomes a threshold voltage Vth_RX of the reset transistor RX. Generally, substrate doping conditions of the reset and transfer transistors are the same as each other, and thus the threshold voltage of the transfer transistor is similar to that of the reset transistor (Vth_RX=Vth_TX).

The state according to the condition described above corresponds to the boundary between a linear region and a saturation region of a general metal-oxide layer-semiconductor (MOS) transistor, in which an edge of the transfer transistor adjacent to the floating diffusion node begins to be turned on by the definition of the threshold voltage Vth. Accordingly, at the time when the edge of the transfer transistor adjacent to the floating diffusion node is turned on, a specific amount of electrons may suddenly overflow into a channel region of the transfer transistor from the floating diffusion node, and thus a voltage difference in the floating node based on variations of the electron amount becomes relatively increased due to the capacitance of the diffusion node. Also, the electron amount coming over from the floating diffusion node causes a great change in the small difference of the threshold voltage due to the process characteristics of the transfer transistor and the reset transistor. Such non-uniformity of the electron amount coming over from the floating diffusion node causes irregular reset conditions, which may result in poor image quality.

Moreover, when the electron comes over to the channel region of the transfer transistor from the floating diffusion node, the photodiode is not operated in the full depletion condition to reduce the reset voltage of the photodiode, and thus the electron remaining in the photodiode serves as a source generating a dark current.

The problems that may be caused by unstable reset and transfer operations of the transfer transistor may include poor noise characteristics, such as an increase in dark current and fixed pattern noise.

Further, in the general reset operation, the reset transistor RX is turned on, thereby maintaining the floating diffusion node as a low impedance node, and the voltage is almost the same as VDD-Vth_RX. On the contrary, in the transfer operation, when the reset transistor RX is turned-off, the floating diffusion node is at a high impedance level, and thus the voltage of the floating node becomes lower than VDD-Vth_RX by flowing the electrons in the channel region of the reset transistor RX into the floating node due to clock feedthrough. Then, the voltage becomes greater due to capacitive coupling depending on the gate voltage of the transistor. In this process, the voltages of the floating node in the reset and transfer operations are different from each other. Such different voltage levels can inhibit dark current and other noises by employing a pinned photodiode which is fully depleted (i.e., completely reset), that is, employing a structure which may fully deplete the pinned photodiode by driving a pixel in the condition for fully depleting the photodiode. Notwithstanding this, a structure that may fully deplete the pinned photodiode has not been disclosed.

However, recently, according to a decrease in scale and operating voltage of semiconductor processes and devices, the voltage of the floating diffusion node has gradually decreased. Thus, pinning voltage of the pinned photodiode has also decreased, and the photodiode is operated in a condition of non-fully depleted pinned photodiode (NFD-PPD) (Bongki Mheen et al., "Operation Principles of 0.18-μm Four-Transistor CMOS Image Pixels with a Non-fully Depleted Pinned Photodiode", IEEE Trans, Electron Devices, col. 53, no. 1, 2006). In order to prevent such a phenomenon, the pinning voltage has to be lowered according to the decrease in operating voltage. However, the decrease is limited because it may make pixel characteristics such as well capacity worse.

Also, since a specific level of voltage barrier exists between the pinned photodiode and the channel of the transfer transistor, a difference between the pinning voltage and the voltage of the floating diffusion node has to be enough to sufficiently lower such a barrier in turning-on the transfer transistor. If the barrier is not sufficiently lowered, the pinned photodiode is not completely reset, which may result in more serious problems, as described above. In other words, the decrease in operating voltage represented as a power supply voltage VDD generally may reduce the difference between the pinning voltage and the voltage of the floating diffusion node, and may cause low well capacity and insufficient reset (i.e., depletion).

In conventional art, a method of compulsorily raising a voltage of a floating diffusion node from VDD-Vth, a common voltage, to VDD by a voltage applied to the gate of the reset transistor Rx, which is formed by applying a boosting circuit, and a method of sufficiently and rapidly raising the voltage of the floating diffusion node to VDD using a PMOS transistor, rather than a conventional NMOS transistor, as the reset transistor are disclosed.

However, the method using the voltage boosting circuit may deteriorate reliability of a gate oxide layer by applying a voltage higher than a general operation condition, and the method using the PMOS transistor as the reset transistor Rx may reduce a fill factor because the PMOS transistor occupies a larger area than the NMOS transistor and have a twice higher noise level than the NMOS transistor. Also, despite the improvement of the characteristic on the condition of complete reset, this method has limitations.

SUMMARY OF THE INVENTION

The present invention is directed to an image sensor capable of reducing a dark current caused by unstable reset of a photoresist and effectively suppressing noise caused by discordance of characteristics between pixels, and a method of driving a transfer transistor.

The present invention is also directed to an image sensor capable of performing reset and transfer on specific levels even when a photodiode is not completely reset, and a method of driving a transfer transistor. On the other hand, when the photodiode is completely reset, the image sensor may be still improved using the present invention.

The present invention is also directed to an image sensor capable of operating a transfer transistor, which is in the image sensor, in a pseudo pinch-off state, and a method of driving the transfer transistor.

The present invention is also directed to an image sensor capable of effectively suppressing a dark current and noise in a low operating voltage environment and/or with low costs, and a method of driving the transfer transistor.

One aspect of the present invention provides an image sensor including: a photosensitive pixel including a photodiode for generating a photoelectron, a transfer transistor for transferring the photoelectron to a diffusion node and a reset transistor for resetting the diffusion node; a driving circuit for generating a driving switching signal with respect to the transfer transistor and the reset transistor; and an intermediary circuit for changing characteristics of the signal to drive the photosensitive pixel in a pseudo pinch-off mode.

The intermediary circuit may include a rising relief circuit for changing the switching signal of the driving circuit to provide it to the photosensitive pixel and for relieving rising of the driving switching signal to the transfer transistor.

The intermediary circuit may change characteristics of the driving switching signal to have a turn-on voltage applied to a gate of the transfer transistor lower than a gate voltage of the reset transistor.

The intermediary circuit may include a turn-on level down shift circuit to lower a turn-on voltage level of the driving switching signal to the transfer transistor.

The turn-on level down shift circuit may include a voltage divider. The turn-on level down shift circuit may comprise a pull-up PMOS transistor, a pull-down NMOS transistor; and a CMOS inverter circuit including a device for voltage drop connected between a source and a turn-on voltage terminal of the pull-up PMOS transistor.

The intermediary circuit may include a turn-on level up shift circuit for raising a turn-on voltage level of a reset signal to the reset transistor among the switching signals of the driving circuit, and may also include a power voltage up shift circuit for raising a power voltage applied to a drain of the reset transistor.

The intermediary circuit may further include a turn-off level shift circuit for lowering a turn-off voltage level of the driving switching signal to the transfer transistor.

Another aspect of the present invention provides an image sensor including: a photosensitive pixel including a photodiode for generating a photoelectron, a transfer transistor for transferring the photoelectron to a diffusion node and a reset transistor for resetting the diffusion node; a driving circuit for generating driving switching signals to the transfer transistor and the reset transistor; and an intermediary circuit for changing characteristics of the signal to drive the driving switching signal in a hole-accumulation mode.

The present invention includes operating a transfer transistor in a pseudo pinch-off state. Here, the term "pseudo pinch-off" is a concept similar to a pinch-off in a steady state, but it has a slightly different aspect. That is, in an aspect of a voltage applied to a transfer transistor, a voltage applied to a gate of the transfer transistor is higher than that applied to a source, which is higher than a threshold voltage between the source and gate, but lower than a threshold voltage between a channel of the transfer transistor and a diffusion node. This is similar to the transfer transistor operated in a saturation region such that the current is not changed according to a diffusion node voltage in a common steady state.

To form the pseudo pinch-off condition, a voltage applied to the gate of the transfer transistor is lowered, or a voltage of the diffusion node is raised.

The image sensor includes: a photosensitive pixel having a light receiving unit for generating a photoelectron, a transfer transistor for transferring the photoelectron to a diffusion node and a reset transistor for resetting the diffusion node and the photodiode; a driving circuit for generating a switching signal to the transfer transistor and the reset transistor; and an intermediary circuit for providing the photosensitive pixel by changing the switching signal of the driving circuit and including a rising relief circuit for relieving rising of a driving signal to the transfer transistor and/or a turn-on and/or turn-off level shift circuit to lower a turn-on voltage level of a driving switching signal to the transfer transistor.

The image sensor of the present invention includes a transfer transistor for transferring a photo-induced charge generated from the photodiode, and also includes an intermediary circuit for changing driving conditions to always operate the transfer transistor in the pseudo pinch-off mode.

A specific method of changing the driving condition includes controlling a channel voltage of the transfer transistor to be lower than a voltage of the diffusion node during a partial or entire section of the turning-on the transfer transistor. To this end, the diffusion node voltage has to be greater than a value obtained by subtracting a threshold voltage of the transfer transistor from a turn-on voltage applied to the gate of the transfer transistor. As a result, the gate voltage of the transfer transistor is controlled to be lower than the voltage obtained by adding the threshold voltage to the voltage of the diffusion node. To realize the driving method, the present invention uses the intermediary circuit, which reduces production costs by minimizing modification of a conventional image sensor.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 9A is a timing diagram illustrating a method of driving a reset transistor according to conventional art;

FIG. 9B is a timing diagram illustrating a method of driving a reset transistor according to yet another exemplary embodiment of the present invention;

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various types. Therefore, the present exemplary embodiments are provided for complete disclosure of the present invention and to fully inform the scope of the present invention to those ordinarily skilled in the art.

While a photosensitive pixel of the present invention is applied to a 4-transistor CMOS image sensor in the following embodiment, it may be applied to a structure of a different image sensor including a transistor for moving a photodiode and a photo-induced charge created in the photodiode, for example, a low-voltage output terminal sensing circuit, which is also included in a scope of the present invention.

An image sensor of the present embodiment includes a photosensitive pixel, a driving circuit and an intermediary circuit. Here, the driving circuit employs a conventional driving circuit in a CMOS image sensor, so a detailed description thereof will be omitted. The general driving circuit applies a power supply voltage applied to an image sensor (which is denoted as VDD) as a turn-on voltage, and a ground voltage applied to the image sensor as a turn-off voltage, to a gate of each transistor in the CMOS image sensor.

Figure 2A:
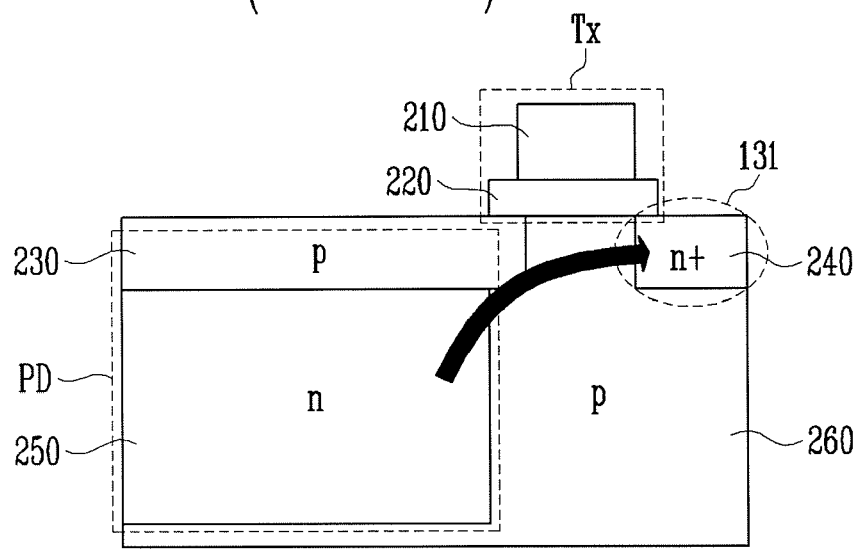
FIG. 2A is a cross-sectional view of photodiode and transfer transistor regions in a photosensitive pixel according to conventional art which may be included in a CMOS image sensor.
Figure 2B:
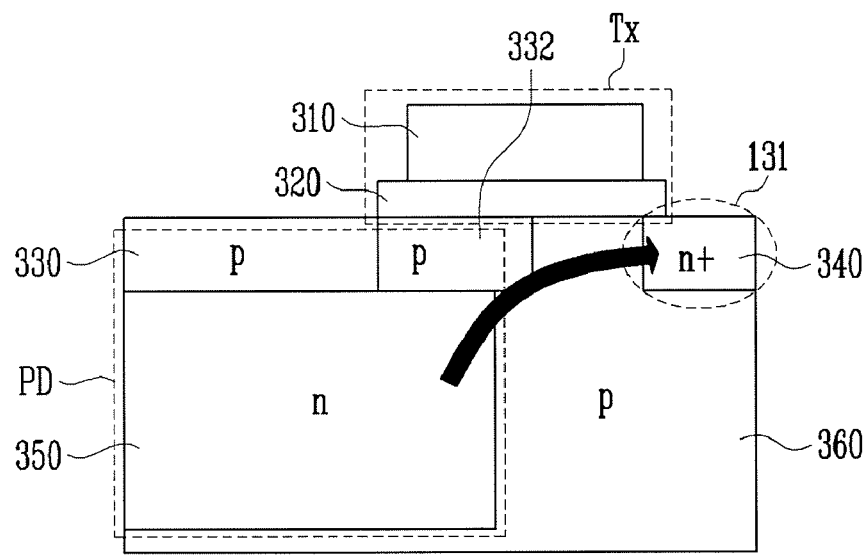
FIG. 2B is a cross-sectional view of photodiode and transfer regions in a photosensitive pixel having an intermediate doping region which may be included in a CMOS image sensor.

FIG. 2A illustrates a general structure of a photosensitive pixel including a photodiode and a transfer transistor, which is applicable to the CMOS image sensor of the embodiment, and FIG. 2B illustrates an improved structure of a photosensitive pixel which has an advantage of application to the CMOS image sensor of the embodiment.

FIG. 2B shows a 4-transistor photosensitive pixel having a photodiode PD, a transfer transistor TX and a floating diffusion region 131, wherein the transfer transistor TX is composed of a gate 310, a gate oxide layer 320 and a p-type substrate 360, the photodiode PD is composed of a photodiode (n type) doping region 350 and a surface $p^+$ type doping region 330, and a diffusion node 340 is doped with $n^+$ type impurities. Here, a p⁻ type doping region in contact with the transfer transistor TX is formed adjacent to the p⁰ type doping region 330, and performance of the image sensor may be improved by additional hole-accumulation in the p⁺ type doping region 332 when a negative voltage is applied to the gate of the transfer transistor TX.

There are several methods of fabricating a transfer transistor having the structure illustrated in FIG. 2B, and a method capable of minimizing modification of a conventional fabrication process of the image sensor is as follows. A p-type region 330 of a general photodiode is formed by implanting p-type dopant materials such as boron (B) after forming a gate oxide layer. Here, some implanted dopant materials are out-diffused to the gate oxide layer by the subsequent annealing process at an interface of the dopant material. While the conventional method tried to minimize the diffusion of the dopant materials, the present method forms a p-type region 332 overlapping the gate electrode 310 by optimizing the diffusion of the dopant materials. That is, among the p-type regions 330 and 332 of the photodiode, the region 332 overlapped with the gate electrode 310 is formed by lateral diffusion of the dopant materials.

Another method of fabricating a transfer transistor in the present embodiment may form a p-type region 332 overlapping the gate electrode 310 with an original p-type region 330 of a photodiode in one body or separately using a separate lithography process and a subsequent deposition process before forming the gate electrode 320.

In the latter case, the p-type doping region 332 is doped in a different pattern from the surface p-type doping region in the photodiode. The surface p-type doping region in the photodiode is generally formed by a somewhat complicated doping process, which is performed more than twice in order to increase photosensitivity and/or reset efficiency. The p-type doping region 332 serves to improve the efficiency of hole accumulation and charge transfer. Thus, it has to be doped in an advantageous type, may not need to be double-doped, and may not be as thin as the surface p-type region 230. The p-type region 332 having sufficient thickness may maximize a trap removal effect generally caused by the p-type doping region 332 under the gate oxide layer.

The structure of an intermediary circuit according to the present invention will now be described. The intermediary circuit may be turned on or turned off in a pseudo pinch-off state by receiving an input waveform, and include at least one of on-voltage, off-voltage and on/off conversion slope functions to be operated in a hole-accumulation mode.

To be specific, the intermediary circuit serves to change a turn-on/off level or a slope of a switching signal applied to a gate of the transfer transistor, in the photosensitive pixel, change the turn-on level of the switching signal applied to a gate of a reset transistor, or change a drain voltage of the reset transistor.

Also, an image sensor of the present invention may be realized to bias a negative voltage to a substrate with the intermediary circuit. The negative voltage may be self-produced by a charge pumping technique or provided from an external source.

Figure 3A:
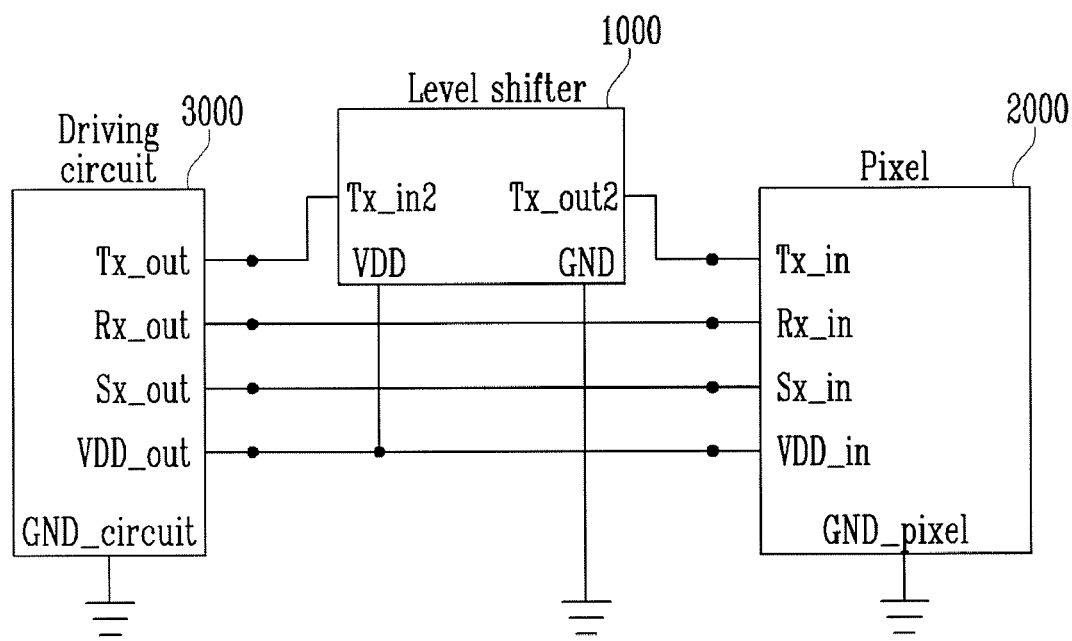
FIGS. 3A and 3B are block diagrams illustrating an overall constitution of a CMOS image sensor including a signal converter of a transfer transistor, or a transfer transistor and a reset transistor.
Figure 3B:
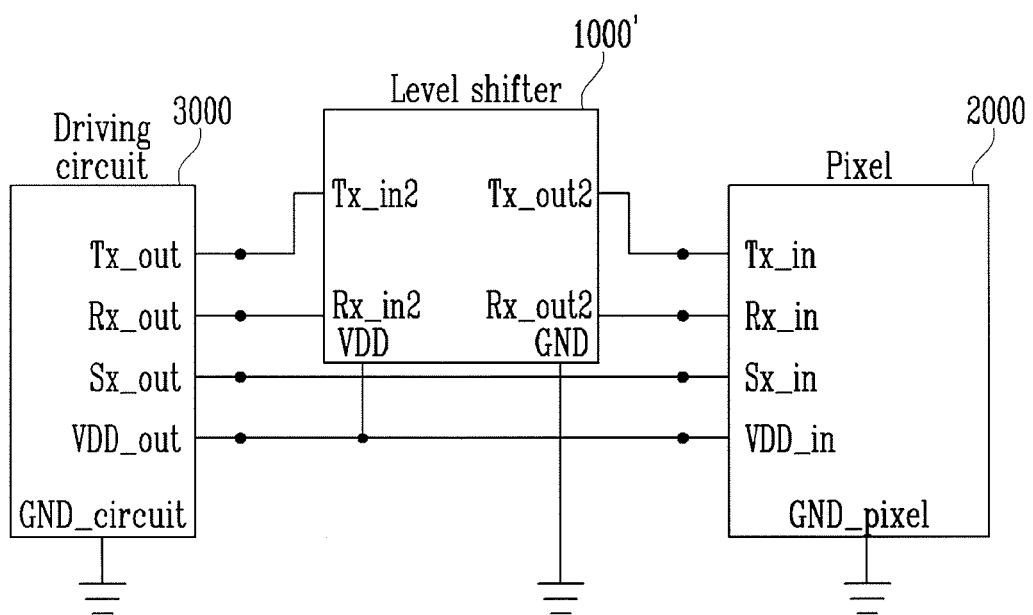

FIGS. 3A and 3B illustrate a connection structure of an intermediary circuit in an image sensor according to exemplary embodiments of the present invention. The intermediary circuit 1000 changes only a switching signal with respect to a transfer transistor TX in a photosensitive pixel, and receives a power supply voltage and a ground voltage, which are at the same level as a driving circuit 3000 and a photosensitive pixel 2000. However, the intermediary circuit 1000 may receive a different level of voltage depending on realizations.

Meanwhile, in FIG. 3B, another intermediary circuit 1000' further having a function of converting a switching signal with respect to a reset transistor Rx in addition to the structure of FIG. 3A is illustrated.

A turn-on level down shift circuit, a turn-off level shift circuit and a rising relief circuit with respect to a transfer transistor constituting an intermediary circuit will now be described according to the present invention.

The turn-on level shift circuit may be realized to lower a turn-on level of a switching signal inputted using a voltage divider simply formed of a resistor (in this case, the turn-off level is almost 0, and thus changes by the voltage divider are insignificant), or realized by including a CMOS latch circuit or a CMOS inverter circuit having a source of a pull-up PMOS transistor connected to a power supply voltage terminal via a transistor or diode for voltage drop.

The effect when the switching signal in which a turn-on level is shifted by the turn-on level shift circuit is provided to the gate of the transfer transistor in the photosensitive pixel will be described.

Figure 1:
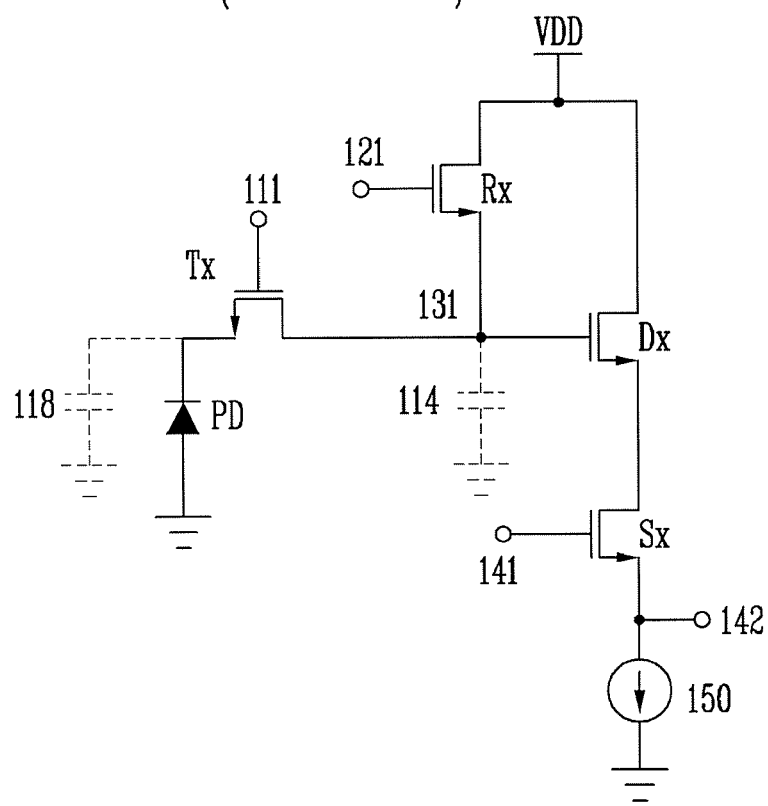
FIG. 1 is a circuit diagram illustrating a structure of a photosensitive pixel in a 4-transistor image sensor.
Figure 4A:
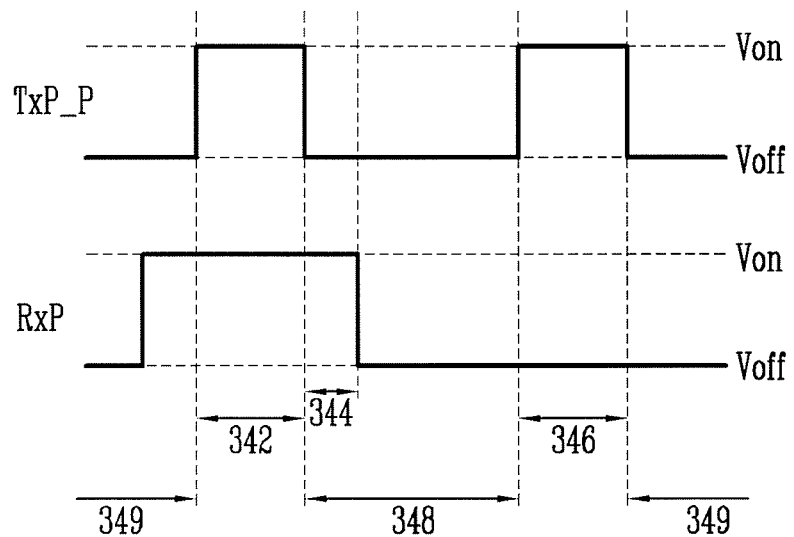
FIG. 4A is a timing diagram illustrating a method of driving a transfer transistor according to conventional art.

FIG. 4A illustrates a switching signal applied to a gate of a transfer transistor according to conventional art. In the conventional art illustrated in FIG. 4A, it can be seen that turn on/off levels of a switching signal RxP of a reset transistor are the same as the turn on/off levels (Von/Voff) of a switching signal TxP_P of a transfer transistor. Here, Von generally denotes a power supply voltage value (VDD) of FIG. 1, and Voff generally denotes a ground voltage value.

Figure 4B:
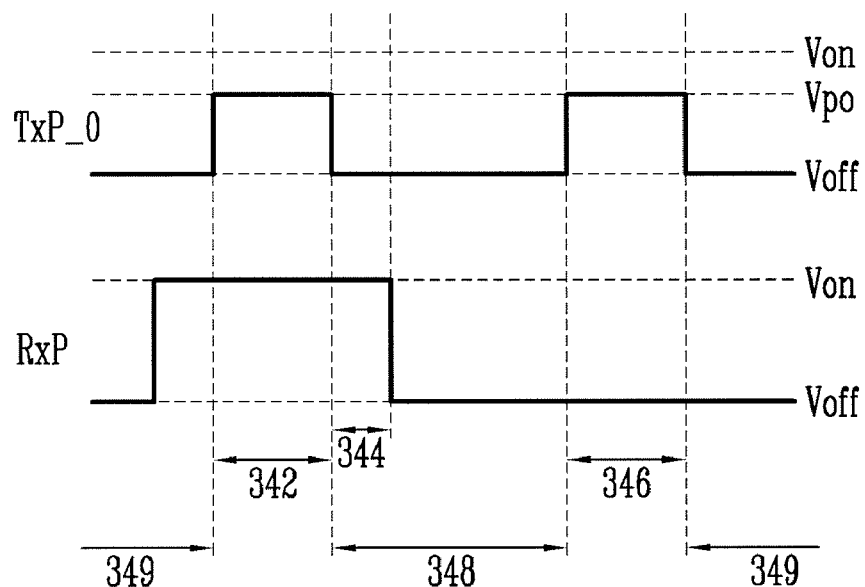
FIG. 4B is a timing diagram illustrating a method of driving a transfer transistor according to an exemplary embodiment of the present invention.

FIG. 4B illustrates a switching signal applied to a gate of a transfer transistor according to an exemplary embodiment of the present invention. The switching signal may be divided into a photodiode reset section 342, a diffusion node reset section 344, an electron accumulation section 348 by a photon and a section 346 of moving the electron accumulated in the photodiode to the diffusion node by time. Additionally, there is a read section 349, which corresponds to a section sequentially reading several pixels and is generally shorter than the electron accumulation section 348 by a photon.

In FIG. 4B, a pseudo pinch-off voltage is applied to the gate of the transfer transistor in the section denoted as reference numeral 342, which is a part or all of the reset section of the photodiode. Depending on realizations in the all or partial reset or transfer section, which includes the region denoted as reference numeral 342, the pseudo pinch-off voltage is applied to the gate of the transfer transistor.

The application of the pseudo pinch-off voltage forms the pseudo pinch-off state, in which a charge in a channel of the transfer transistor is less influenced by a charge in another part, for example, a charge in the diffusion node. That is, as a higher voltage is applied to the transfer transistor, the floating node and a channel of the transfer transistor are connected to each other, and the charge in the diffusion node flows to the channel of the transfer transistor. Such a phenomenon affects the reset of the transfer transistor and the transfer of a photo-induced charge, and results in deterioration of characteristics of several pixels. The pseudo pinch-off voltage is applied as a turn-on voltage of the transfer transistor, which may solve these problems and prevent quality deterioration of an image sensor according to deviation of the fabrication process.

Meanwhile, if the threshold voltages of the reset transistor and the transfer transistor are equal, the pseudo pinch-off voltage has a slightly lower value than the voltage applied to the gate of the reset transistor (preferably, 0.1V to VDD/2), and serves to reset the transfer transistor and transfer the photo-induced charge by the pseudo pinch-off voltage. Thus, an amount of charges transferred to the channel of the transfer transistor is less influenced by a different charge amount, for example, an amount of charges in the floating node, thereby obtaining an improved effect in comparison to the conventional method.

In the conventional method, the reset transistor and the transfer transistor are driven by applying a power supply voltage (VDD) to both the gates thereof, which means that the charge amount in the channel of the transfer transistor may be sufficiently influenced by the charge amount in the floating node in consideration of the fact that the threshold voltages of the transfer transistor and the reset transistor are equal.

That is, since the photodiode that is not fully depleted has a uniform amount of charges which are not reset according to the characteristics of the pseudo pinch-off state and is less influenced by modification of other environmental factors, an exact photosensitive value having a less noise than the conventional art may be obtained by offsetting a specific value corresponding to the non-reset charge amount. However, a too low gate voltage of the transfer transistor may not sufficiently reduce a barrier between the photodiode and the channel of the transfer transistor, thereby lowering transfer or reset ability, and thus excessive reduction of the gate voltage has to be avoided. Also, this method may have similar effects on a fully-depleted photodiode.

The term "pseudo pinch-off state" was named by considering that a MOS transistor is physically operated in a similar state to a pinch-off mode. The pseudo pinch-off gate voltage, in order to have the pseudo pinch-off state, may be at a level between a voltage several hundreds mV lower than the power supply voltage corresponding to VDD of FIG. 1 and a half of the power supply voltage.

In the photoelectron transfer section 346 of FIG. 4B, the pseudo pinch-off voltage may be applied to the gate of the transfer transistor, thereby providing stability in the pseudo pinch-off state, and the amount of remaining charges, which do not transfer to the floating diffusion node from the photodiode, may be maintained at a specific level, thereby improving accuracy of a photoelectron transfer operation. In this case, a remaining charge amount during resetting and a remaining charge amount during reading become uniform, and a separate CDS circuit may be omitted, thereby manufacturing a CMOS image sensor having a simpler structure. Here, the pseudo pinch-off voltages in the photoelectron transfer section 346 and the reset section 342 may be set equally, or set to be slightly different.

On the other hand, the power supply voltage VDD or another voltage may be applied in the reset section 346 like the conventional art.

Meanwhile, if the reset operation is sufficiently performed using a pinned photodiode, a general turn-on voltage may be applied in the reset section 342, and the pseudo pinch-off voltage may be applied in the photoelectron transfer section 346.

Figure 5A:
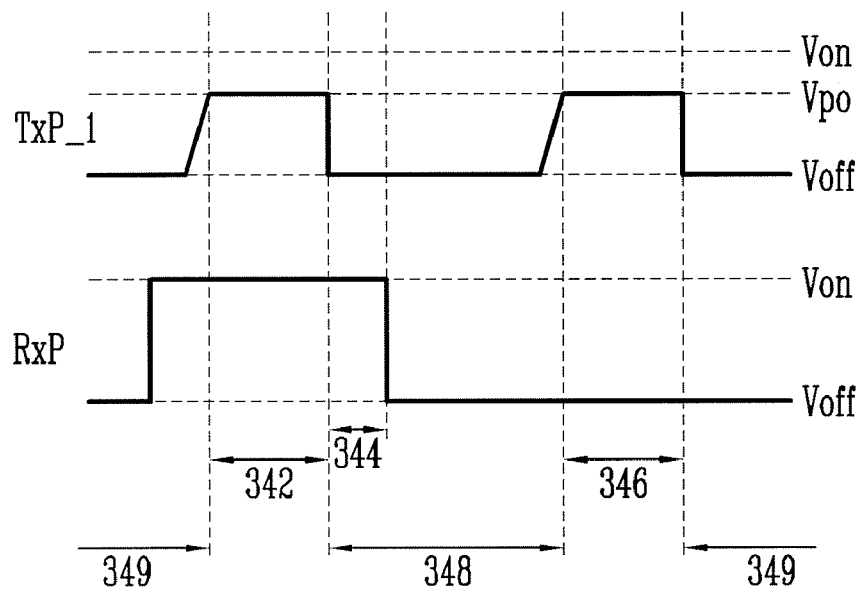
FIGS. 5A and 5B are timing diagrams illustrating a method of driving a transfer transistor according to another exemplary embodiment of the present invention.
Figure 5B:
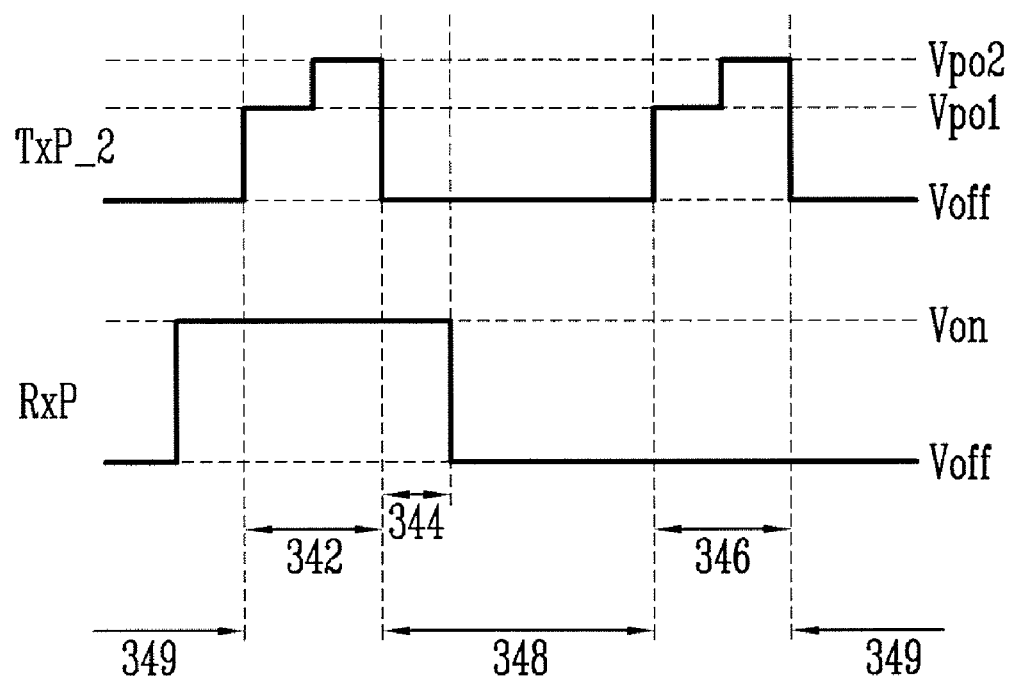

The rising relief circuit may be linearly delayed to rise, as illustrated in FIG. 5A, or may allow to rise step by step, as illustrated in FIG. 5B.

Figure 6A:
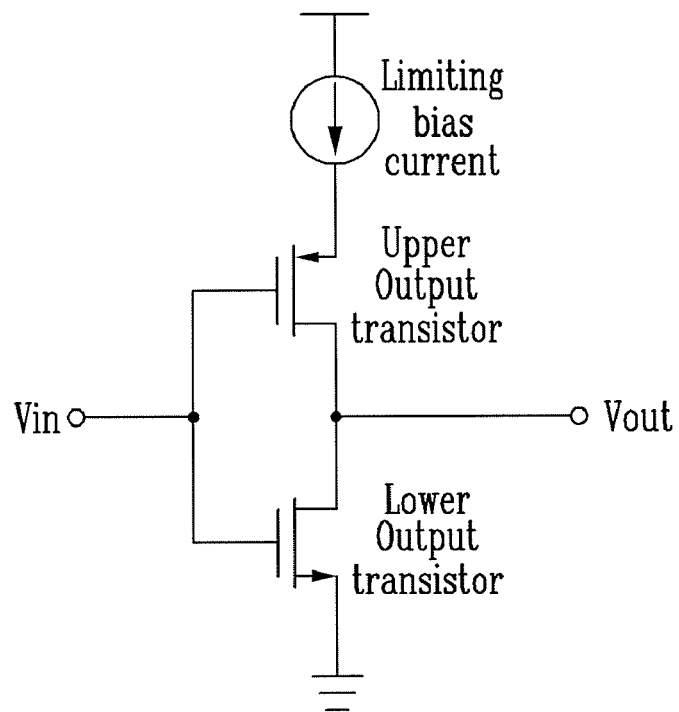
FIGS. 6A and 6B are a conceptual circuit diagram of a rising alleviation circuit and a schematic circuit diagram using the same according to an exemplary embodiment of the present invention.
Figure 6B:
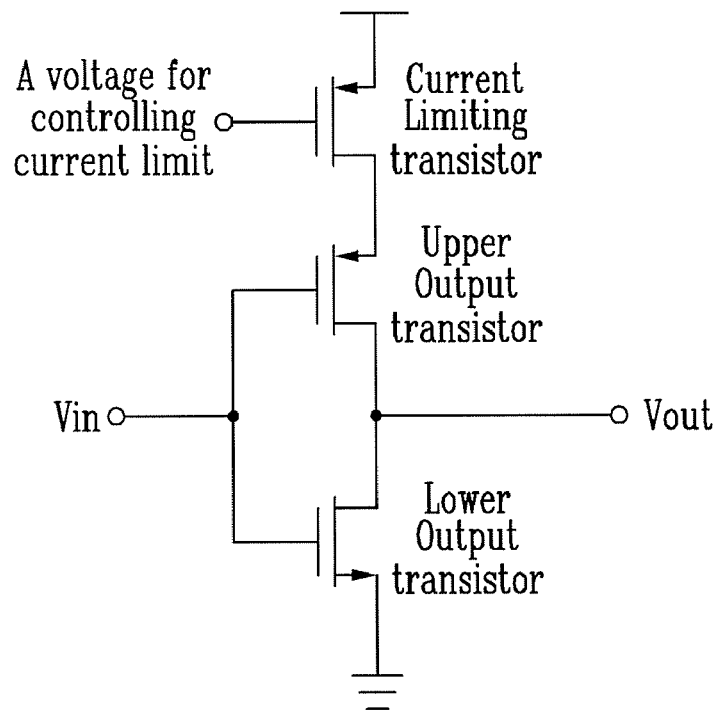

In FIG. 5A, the rising relief circuit may be realized as a latch circuit in which a CMOS transistor inverter having a source terminal of a pull-up PMOS transistor connected to a turn-on voltage terminal via a current limiting device and a source terminal of a pull-down NMOS transistor connected to a turn-off voltage terminal is included in a final output terminal. FIG. 6A illustrates a conceptual diagram of the inverter circuit, and FIG. 6B illustrates the inverter circuit according to an exemplary embodiment of the present invention. The current limiting device of FIG. 6B has an advantage of simply changing a slope by controlling a voltage, which may be realized as a MOS transistor having a smaller channel than the pull-up/down MOS transistor.

The effect when a switching signal whose rising time is delayed by the rising relief circuit is provided to a gate of the transfer transistor in a photosensitive pixel will now be described.

A rising time (i.e., a leading time) of a waveform of a switching signal to the transfer transistor affects a pseudo pinch-off state. As the rising time becomes longer, an amount of charges applied to the gate of the transfer transistor may be reduced. That is, as the slope of this signal becomes smaller, a more stable pseudo pinch-off state may be made.

FIG. 5A showing rising which is linearly delayed illustrates another embodiment of a switching signal smoothly applying a pseudo pinch-off voltage to a gate in order to obtain more stable pseudo pinch-off state. When entering from section 349 to section 342, a switching voltage TxP_1 of the transfer transistor goes up to a pseudo pinch-off voltage Vpo from a turn-off voltage Voff. Here, the rising time (hereinafter, referred to as a "minimum rising time") is twice or more than that of an output signal from a general switching controller when no action is taken to its signal output means.

FIG. 5B showing rising which is delayed step by step illustrates a switching signal applying a pseudo pinch-off voltage to a gate step by step to obtain a more stable pseudo pinch-off state. When entering from section 349 to section 342, a switching voltage TxP_2 of a transfer transistor goes up to a pseudo pinch-off voltage Vpo from a turn-off voltage Voff. In FIG. 5B, the switching voltage rises to a first pseudo pinch-off voltage Vpo1, and rises again to a second pseudo pinch-off voltage Vpo2 after a predetermined time. Depending on realizations, the voltage may be applied in more than 3 levels, and a power supply voltage VDD may be finally applied by increasing the voltage step by step. Although a gate voltage is sequentially raised to be at the same level as the power supply voltage VDD, the transfer transistor may be maintained in a pseudo pinch-off state to a certain degree.

Driving the transfer transistor in multi-levels as described above helps maintain the transfer transistor in the pseudo pinch-off state. That is, the methods illustrated in FIGS. 5A and 5B reduce an upswing of a switching signal applied to the gate of the transfer transistor per time, thereby suppressing as much of a voltage rise in a channel as possible in comparison to that in the floating diffusion node, and thus the transfer transistor may be kept in the pseudo pinch-off region.

A turn-off level shift circuit will now be described.

The turn-off level shift circuit uses a voltage lower than a driving ground voltage to which an image sensor is applied as a turn-off level. Accordingly, if the image sensor has another circuit producing a lower voltage than the driving ground voltage, the turn-off level shift circuit may use the voltage produced from the circuit, or may further include a separate charge pump (pumping is performed in a negative direction) to lower a voltage.

The turn-off level shift circuit may include a CMOS latch circuit or a CMOS inverter circuit, which has a source of a pull-down NMOS transistor connected to a lower voltage than a ground voltage generated by the charge pump in addition to the separate charge pump.

Figure 7:
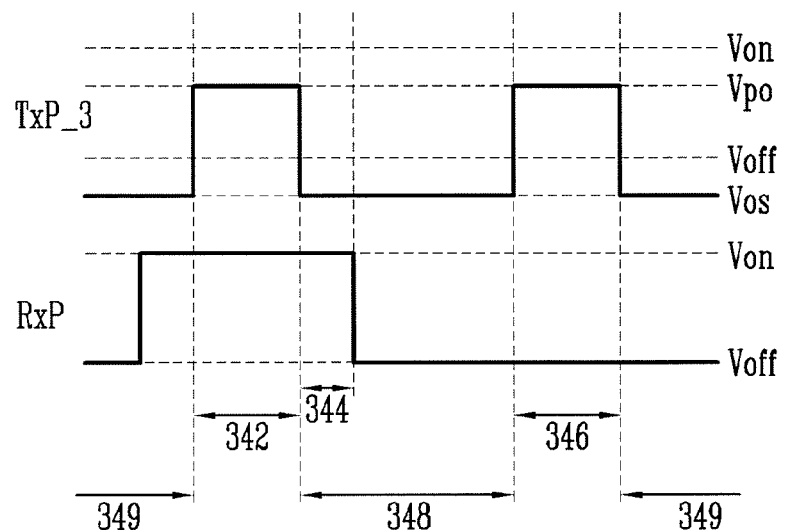
FIG. 7 is a timing diagram illustrating a method of driving a transfer transistor according to still another exemplary embodiment of the present invention.

Transformation in a waveform of the switching signal is useful for the image sensor having the structure of FIG. 2B, and thus the effect when the switching signal in which a turn-off level is shifted by the turn-off level shift circuit is provided to a gate of a transfer transistor in a photosensitive pixel will now be described with reference to FIG. 2 illustrating its structure and FIG. 7 illustrating its timing.

In an integration section 348, a specific negative off-set voltage Vos may be applied to the gate 310 of the transfer transistor, thereby accumulating holes in a p-type doping region 332 in contact with the transfer transistor through a gate oxide layer 320. Here, a trap is inactivated in the p-type doping region 332 in contact with a transfer transistor and electron-hole pairs are reduced, thereby reducing a dark current. Moreover, a voltage of the gate 310 applied in a section in which the transfer transistor is off increases a potential barrier under the gate oxide layer 320, and thus increases well capacity of electrons capable of being accumulated in a photodiode.

In FIG. 7, while the same off-set voltage Vos is applied in a read section 349, another voltage such as a ground voltage Voff may be applied depending on realizations. The negative offset voltage may be determined between approximately −0.1V and −1.0V, especially at a point in which the inactivity of the trap is the most excellent, to ensure optimized performance.

The offset voltage used in the present invention needs a negative value having a smaller absolute value than a power supply voltage, and thus a pumping circuit needed to produce the offset voltage may be easily realized by well-known technology, for example, a voltage divider.

Changing a switching signal with respect to a reset transistor or a drain voltage will now be described.

Figure 8:
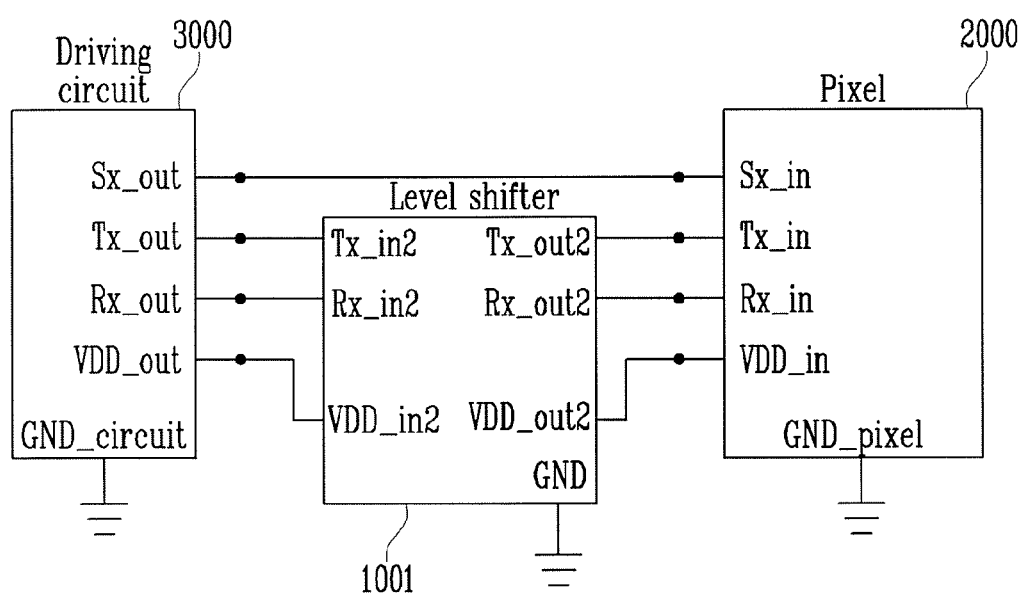
FIG. 8 is a block diagram illustrating an overall construction of a CMOS image sensor which may be used to realize the embodiment of FIG. 7.

FIG. 8 illustrates a connection structure in an image sensor of an intermediary circuit changing a switch signal to a reset transistor and a drain voltage according to an exemplary embodiment, and FIGS. 9A and 9B compare switching signals according to conventional art and the present invention.

In FIG. 8, a power supply voltage that an intermediary circuit 1001 transforms may be provided as a drain voltage of a reset transistor, or as an overall power supply voltage with respect to a photosensitive pixel. Also, a power voltage adjustment part may be omitted depending on realizations.

The most important thing for pseudo pinch off in the present invention is keeping the voltage of a diffusion node sufficiently higher than a voltage of a channel of a transfer transistor TX, which may be realized by lowering a voltage of a gate of the transfer transistor or raising a voltage of a gate of the reset transistor. This may be realized by making a specific voltage difference by applying a higher gate voltage of the reset transistor than that of the transfer transistor, not by applying the same voltage to the gate of the transfer/reset transistors as in the conventional method.

As can be seen from FIGS. 9A and 9B comparing the conventional art with the present embodiment, when a gate turn-on voltage of the reset transistor increases (by Vx), an entire voltage of the diffusion node may increase (that is, the voltage increases in a waveform drawn in a solid line from that drawn in a dotted line in FIG. 9B). Considering that a voltage of the gate of the transfer transistor is lowered for pseudo pinch-off mode drive when a voltage of the diffusion node is on a normal level, the drive in the pseudo pinch-off mode by increasing the gate turn-on voltage of the reset transistor can be a useful alternative.

However, the method of increasing the voltage of the diffusion node only by increasing the turn-on voltage of the gate of the reset transistor has a limit. This is because a drain of the reset transistor is connected to a power supply voltage VDD of a photosensitive pixel, and a voltage of a source is difficult to increase higher than the power supply voltage VDD. Since charges in a channel move to the drain and source when the reset transistor is off, thereby additionally reducing the voltage of the diffusion node, the voltage of the diffusion node may be slightly increased by increasing the turn-on voltage of the gate of the reset transistor, but it is difficult to approximate the power supply voltage. Thus, in order to increase the voltage of the diffusion node by a large margin, a higher voltage than the power supply voltage has to be applied to the drain of the reset transistor, or the power supply voltage of the photosensitive pixel connected to the drain of the reset transistor has to be increased. In FIG. 8, a structure raising the power supply voltage of the photosensitive pixel itself is employed.

Figure 10:
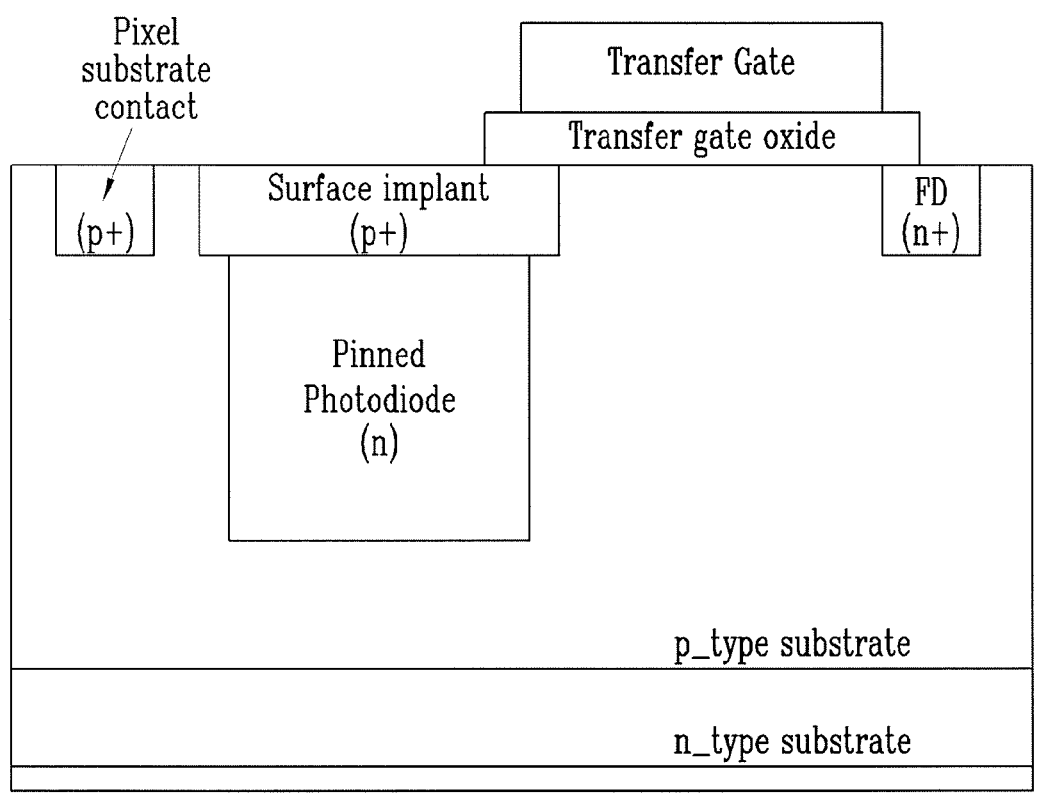
FIG. 10 is a cross-sectional view of a photosensitive pixel including a structure capable of applying a negative offset voltage to a substrate according to yet another embodiment of the present invention.
Figure 11:
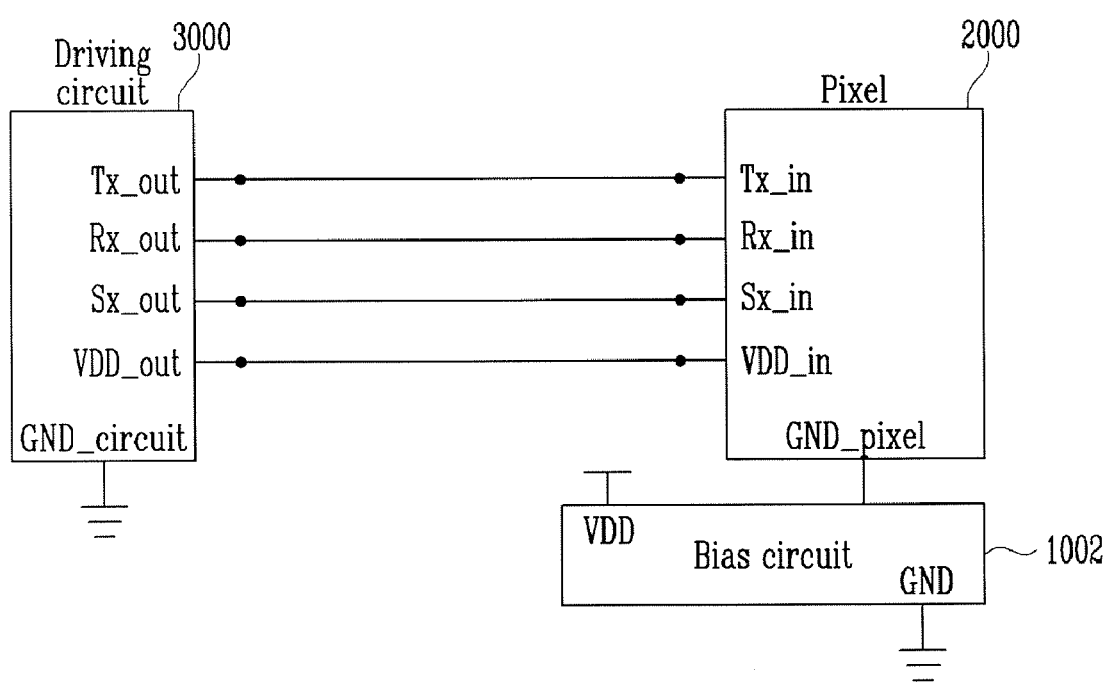
FIG. 11 is a block diagram of a CMOS image sensor which can be employed to realize the exemplary embodiment of FIG. 10.

When a common node of a pixel, i.e., a pixel substrate voltage, is generally set as negative, an electron induced by reset of a photodiode and light may actively move to improve characteristics of the pixel, which is illustrated in FIGS. 10 and 11. In particular, in order to apply a negative voltage to a substrate, the substrate may have a similar structure to that illustrated in FIG. 10, in which a node can apply a lower voltage than a ground applied to the entire substrate. Also, in FIG. 10, an n-type substrate may be disposed under a p-type substrate, thereby applying a negative voltage to the p-type substrate without forward current. Thus, it may be inferred that a similar method may be realized by a p-type substrate doped at a lower concentration than the p-type substrate of the present invention.

For example, the present invention may be realized by waveforms of a switching signal illustrated in FIGS. 4B, 5A, 5B and 7 and another type of waveform of the switching signal including more than two characteristic parts of each waveform of the switching signal, which may be inferred from the above description.

While the present invention is realized by partially depleting a photodiode, it may also be applied to the case using a pinned photodiode. That is, when a transfer transistor is operated in a pseudo pinch-off state, the pinned photodiode is reset or transferred irrespective of the voltage of a floating diffusion node, which may have excellent characteristics as compared to the case which does not use this method.

An image sensor having the structure of the present invention may be used to effectively suppress a dark current and other noises in a lower operating voltage environment.

Also, the present invention may be improved by changing a switching signal applied to a photodiode and a transfer transistor which have conventional structures.

The present invention may suppress a dark current and other noises without forming a pinned photodiode having a separate fully depleted (or completely reset) structure.

Moreover, the present invention can obtain these effects by changing a simple circuit, and may have flexibility to drive a pixel under a different condition depending on situations.

While the invention has been shown and described with reference to certain exemplary embodiments thereof, it will be understood by those skilled in the alt that various changes in form and details may be made therein without departing from the spirit and scope of the invention as defined by the appended claims.

What is claimed is:

1. An image sensor, comprising:
a photosensitive pixel including a photodiode for generating a photoelectron, a transfer transistor for transferring the photoelectron to a diffusion node and a reset transistor for resetting the diffusion node;
a driving circuit for generating a driving switching signal with respect to the transfer transistor and the reset transistor; and
an intermediary circuit for changing characteristics of the signal to drive the photosensitive pixel in a pseudo pinch-off mode, wherein the intermediary circuit comprises a rising relief circuit for providing gradual rising edge pulse portions to a gate of the transfer transistor when entering a photodiode reset section and when entering a photoelectron transfer section, wherein the provided gradual rising edge pulse portions reduce a voltage upswing to the gate of the transfer transistor as a function of time which suppresses a voltage rise in a channel of the transfer transistor which results in substantially keeping the transfer transistor in the pseudo pinch-off mode.

2. The image sensor according to claim 1, wherein the gradual rising edge pulse portions provided to the gate of the transfer transistor when entering the photodiode reset section and when entering the photoelectron transfer section are linear functions delayed to rise.

3. The image sensor according to claim 1, wherein the gradual rising edge pulse portions provided to the gate of the transfer transistor when entering the photodiode reset section and when entering the photoelectron transfer section are rising step functions delayed to rise.

4. The image sensor according to claim 2, wherein the rising relief circuit comprises a CMOS inverter having a source terminal of a pull-up PMOS transistor connected to a turn-on voltage terminal via a current limiting device and a source terminal of a pull-down NMOS transistor connected to a turn-off voltage terminal.

5. The image sensor according to claim 1, wherein the intermediary circuit changes characteristics of the driving switching signal to have a turn-on voltage applied to a gate of the transfer transistor lower than a gate voltage of the reset transistor.

6. The image sensor according to claim 1, wherein the intermediary circuit comprises a turn-on level down shift circuit to lower a turn-on voltage level of the driving switching signal to the transfer transistor.

7. The image sensor according to claim 6, wherein the turn-on level down shift circuit comprises a voltage divider.

8. The image sensor according to claim 6, wherein the turn-on level down shift circuit comprises:
   a pull-up PMOS transistor;
   a pull-down NMOS transistor; and
   a CMOS inverter circuit including a device for voltage drop connected between a source and a turn-on voltage terminal of the pull-up PMOS transistor.

9. The image sensor according to claim 1, wherein the intermediary circuit comprises a turn-on level up shift circuit for raising a turn-on voltage level of a reset signal to the reset transistor among the switching signals of the driving circuit.

10. The image sensor according to claim 9, wherein the intermediary circuit further comprises a power supply voltage up shift circuit for raising a power supply voltage applied to a drain of the reset transistor.

11. The image sensor according to claim 1, wherein the transfer transistor comprises:
   a p-type doping part formed between a surface p-type region of the photodiode and a channel for transferring a charge to the diffusion node from the photodiode, and having a different doping pattern from the surface p-type region of the photodiode;
   a gate oxide layer disposed on the p-type doping part and the charge transfer channel; and
   a gate electrode disposed on the gate oxide layer.

12. The image sensor according to claim 1, wherein the intermediary circuit further comprises a turn-off level shift circuit for lowering a turn-off voltage level of the driving switching signal to the transfer transistor.

13. The image sensor according to claim 12, wherein the turn-off level shift circuit for performing pumping of charges in a negative direction.

14. The image sensor according to claim 1, wherein a negative substrate voltage is applied to the photosensitive pixel.

15. An image sensor, comprising:
   a photosensitive pixel including a photodiode for generating a photoelectron, a transfer transistor for transferring the photoelectron to a diffusion node and a reset transistor for resetting the diffusion node;
   a driving circuit for generating driving switching signals to the transfer transistor and the reset transistor; and
   an intermediary circuit for changing characteristics of the signal to drive the driving switching signal in a hole-accumulation mode wherein the intermediary circuit comprises a rising relief circuit for providing gradual rising edge pulse portions to a gate of the transfer transistor when entering a photodiode reset section and when entering a photoelectron transfer section, wherein the provided gradual rising edge pulse portions reduce a voltage upswing to the gate of the transfer transistor as a function of time which suppresses a voltage rise in a channel of the transfer transistor which results in substantially keeping the transfer transistor in the pseudo pinch-off mode.

16. The image sensor according to claim 15, wherein the transfer transistor comprises:
   a p-type doping part formed between a surface p-type region of a photodiode and a channel for transferring a charge to the diffusion node from the photodiode, and having a different doping pattern from the surface p-type region of the photodiode;
   a gate oxide layer disposed on the p-type doping part and the charge transfer channel; and
   a gate electrode disposed on the gate oxide layer.

17. The image sensor according to claim 15, wherein the intermediary circuit further comprises a turn-off level shift circuit for lowering a turn-off voltage level of the driving switching signal to the transfer transistor.

18. The image sensor according to claim 17, wherein the turn-off level shift circuit for performing pumping of charges in a negative direction.

19. The image sensor according to claim 15, wherein the gradual rising edge pulse portions provided to the gate of the transfer transistor when entering the photodiode reset section and when entering the photoelectron transfer section are linear functions delayed to rise.

20. The image sensor according to claim 15, wherein the gradual rising edge pulse portions provided to the gate of the transfer transistor when entering the photodiode reset section and when entering the photoelectron transfer section are rising step functions delayed to rise.

* * * * *